United States Patent [19]

Lindberg

[11] Patent Number: 5,175,397
[45] Date of Patent: Dec. 29, 1992

[54] INTEGRATED CIRCUIT CHIP PACKAGE
[75] Inventor: Frank A. Lindberg, Relay, Md.
[73] Assignee: Westinghouse Electric Corp., Pittsburgh, Pa.
[21] Appl. No.: 632,688
[22] Filed: Dec. 24, 1990
[51] Int. Cl.[5] ............................................. H01L 23/02
[52] U.S. Cl. .................................. 174/52.4; 361/390; 361/395; 361/404; 361/405; 257/692; 257/704; 257/668
[58] Field of Search ............... 174/52.2, 52.4, 52.3; 361/390, 392, 394, 399, 415, 395, 404, 405; 357/74

[56] References Cited

U.S. PATENT DOCUMENTS 4,320,438  3/1982  Ibrahim et al. ........................ 361/401
4,730,232  3/1988  Lindberg .
4,814,943  3/1989  Okuaki ................................. 361/400

Primary Examiner—Leo P. Picard
Assistant Examiner—Bot Ledinh
Attorney, Agent, or Firm—W. G. Sutcliff

[57] ABSTRACT

A hermetically sealed package for one or more integrated circuit chips that is made of three metal, thick-film layers, and one dielectric, thick-film layer to form a mounting surface for the chip. The first applied metal layer includes the power plane, and the fan-out leads including power and ground leads. The dielectric layer overlays the power plane and includes an annular rectangle overlaying a portion of all the leads of the first layer and an outer boundary strip overlaying extreme ends of the leads. The second screened metallic layer serves as the ground plane, and electrically engages the ground leads of the first metallic layer and the extreme outer ends of the signal leads. A third metallic layer includes a metallic sealing ring on the annular portion of the dielectric layer spaced from the perimeter of the power and ground planes and a plurality of spaced test probe pads overlaying the boundary strip in electrical contact with the first metallic layer, and an optional pad of metal in the central chip mount area. The power and ground leads are provided in the same layer which permits them to be closely spaced without shorting due to misregistration. The grounded metallic sealing ring minimizes capacitive coupling between the outwardly extending leads.

18 Claims, 5 Drawing Sheets

5,175,397

INTEGRATED CIRCUIT CHIP PACKAGE

BACKGROUND OF THE INVENTION

1. Technical Field

The present invention relates to the packaging of integrated circuit chips; and more particularly, to a package for a microelectronic integrated circuit chip and method of fabrication.

2. Background Art

Integrated circuit (IC) chips of extremely small size are typically mounted in the central portion of a support structure or package that includes closely-spaced metallic paths or leads for electrical connection to similarly spaced metallic terminals of the IC chip. The closely spaced metallic leads of the package extend from a point adjacent the mounted chip and fan outwardly in a direction away from the chip to terminate in bonding pads or lead wires that are suitably spaced for connection to test and burn-in apparatus for the IC chip. The size, number and proximity of the bonding connections of the IC chip determine the overall size of the package. The greater the number of leads of the package, the greater the required length of the outwardly extending leads in order to obtain the proper spacing of the bonding pads or lead wires used for burn-in and test connections. This problem was minimized as discussed in my U.S. Pat. No. 4,730,232 dated Mar. 8, 1988, and as pointed out in the patent, after the testing and burning-in of the mounted integrated circuit chip, the package is scribed by a laser along a line adjacent where the metallic paths begin their fanning out. The package is snapped apart along the laser scribe resulting in a smaller package. Thus, the resulting small package would have closely spaced bonding pads for wire bonding to the next level of interconnect, such as a printed circuit board, for example.

Although suitable for the purposes intended, the discussion of the IC package in the above identified U.S. Pat. No., disclosed power, ground, and signal path leads which were limited with respect to the type of chip construction and power and ground requirements.

DISCLOSURE OF THE INVENTION

One of the objects of the present invention is to provide a package and related method of fabrication for an integrated circuit chip that is versatile in its application, yet relatively easy to fabricate.

Another object of the present invention is to provide a method of fabrication and a package for an integrated circuit chip that will accommodate a chip having power and ground connections in close proximity to one another, yet permits alignment tolerance for successive fabrication steps.

Still another object of the present invention is to provide a package for an integrated circuit chip that minimizes the capacitive coupling between the signal path leads of the package.

A further object of the present invention is to provide a method of fabrication and package for an integrated circuit chip that permits ease in varying the thickness or width of the dielectric and conductive portions of the package for different applications.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

To achieve the objects and in accordance with the purpose of the invention, as embodied and broadly described herein, the integrated circuit chip package of the present invention comprises a substrate of insulative material; a first metallic layer overlaying the substrate having a central area portion defining a mounting area for the chip, a first plurality of metallic leads connected to and extending outwardly from the central area portion, and a second plurality of outwardly extending leads spaced from the central area portion. A dielectric layer having a first area portion which overlays and is at least coextensive with the central area portion of the first layer, and has an annular portion surrounding and spaced from the first area portion and overlaying a portion of each of the first and second plurality of metallic leads. A second metallic layer having a central area portion which overlays the first area portion of the dielectric layer and predetermined areas of the second plurality of conductive leads of the first layer without being in electrical contact with the first plurality of conductive leads.

In a more specific aspect, the first and second metallic layers serve as either a power plane or a ground plane.

In a more specific aspect, the first metallic layer is at power potential, the second metallic layer fills in holes or vias in the annular portion of the dielectric; and a third metallic layer contacts the grounded vias.

The package of the present invention may also include a cover having a perimetrical edge coextensive with the third metallic layer soldered to the third metallic layer for hermetically sealing an integrated circuit chip mounted in the defined mounting area; or the third metallic layer may be omitted and the coves directly sealed to the dielectric layer with melted glass.

In another aspect, a method of making a package for an integrated circuit chip in accordance with the present invention comprises providing an insulative substrate; depositing on the substrate a first metallic layer having a central area portion defining a mounting area for the chip with a first plurality of metallic leads connected to and extending outwardly from the central area portion and a second outwardly extending plurality of metallic leads having an inner end adjacent to and spaced from the central area portion a predetermined portion of the second plurality of leads; depositing a dielectric layer including a first area portion on the central area portion of the first layer at least coextensive with the central area portion and including an annular portion surrounding and spaced from the central area portion overlaying a portion of each of the first and second plurality of metallic leads; and depositing a second metallic layer on and overlapping the first area portion of the dielectric layer in electrical contact with the predetermined metallic leads; and depositing a third metallic layer including an annular portion overlaying the annular portion of the dielectric layer in electrical contact with the metallic leads connected to the ground plane.

The accompanying drawings, which are incorporated in and constitute a part of this specification illustrate two embodiments of the invention and together with the description serve to explain the objects, advantages and principles of the invention.

BEST MODE FOR CARRYING OUT THE INVENTION

Figure 1:
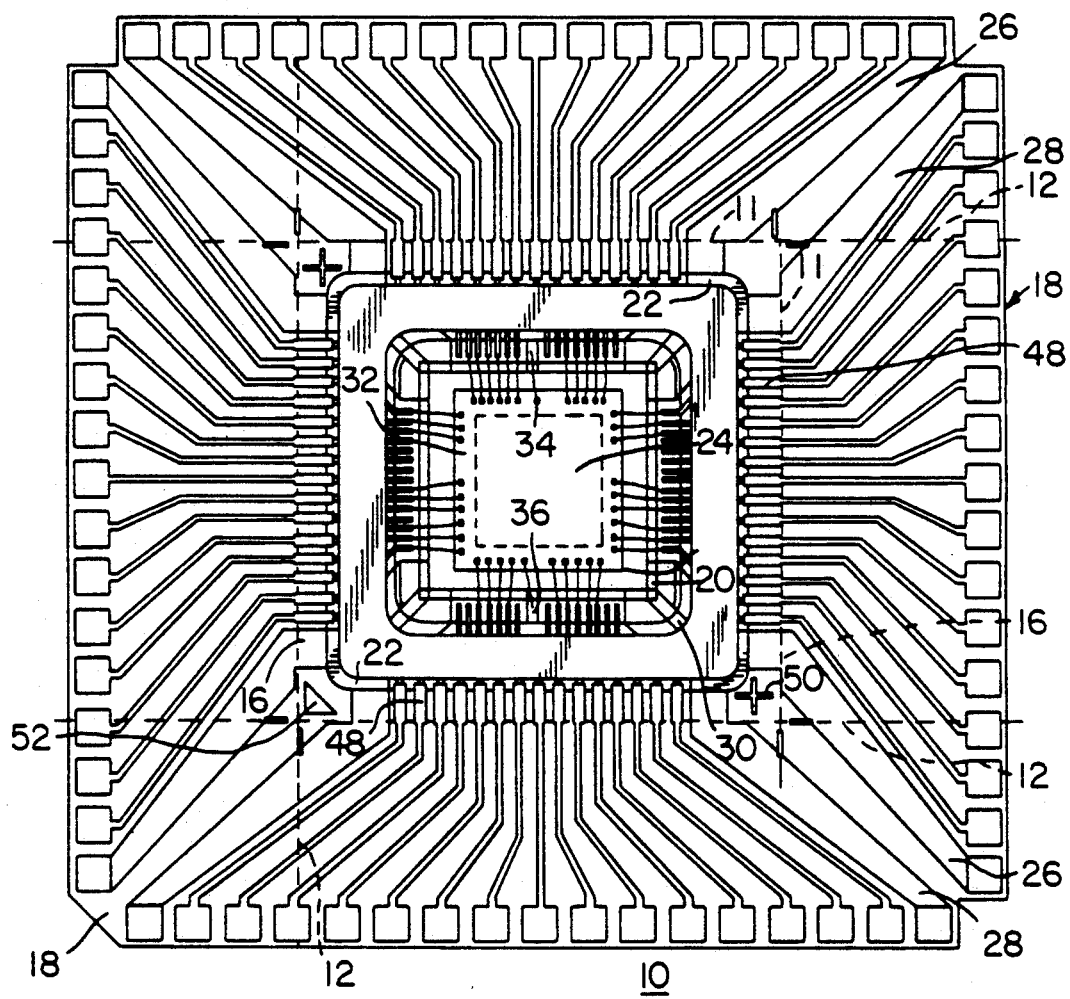
FIG. 1 is a plan view of an integrated circuit chip package incorporating the principles of the present invention and illustrating an integrated circuit chip mounted in the center of the package, and defining the portions of the package that are snapped apart after testing.

Reference will now be made in detail to the present preferred embodiment of the invention, an example of which is illustrated in the accompanying drawings wherein the same reference numerals are used in connection with identical elements shown in different drawings. Referring to FIG. 1, an integrated circuit chip package, generally referred to as reference numeral 10, is illustrated in plan view. Included in this showing are dashed line 12 where a laser is to scribe the package so that the package can be snapped apart to provide a smaller package 16 for mounting to a printed circuit board.

In accordance with the present invention, the package for an integrated circuit chip comprises a ceramic substrate and a first metallic layer overlaying the substrate. The first metallic layer has a central area portion defining a mounting area for the chip and serves as the power or ground plane of the package. The first metallic layer also includes a first plurality of leads connected to and extending outwardly from the central area portion and a second plurality of outwardly extending leads spaced from the central area portion.

As embodied herein, package 10 includes a ceramic insulating substrate 18, and a metallic central plane area 20 which may be a power or ground plane, dielectric layer 22, and a metallic plane area 24 overlays layer 22, and serves either as a power or ground plane. Wide conductive paths or leads 26 extend from central area 20 outwardly to the edge of package 16 when scribed by a laser. Wide conductive paths or leads 28 also extend outwardly to the edge of package 16 and are electrically connected to metallic plane 24. A metallic ring 30 is connected to ground plane 24. Ring 30, as well as minimizing capacitive coupling between leads as hereafter described, is used for soldering a cover to the package 16 for hermetically sealing a chip 32 to be mounted therein.

Figure 2:
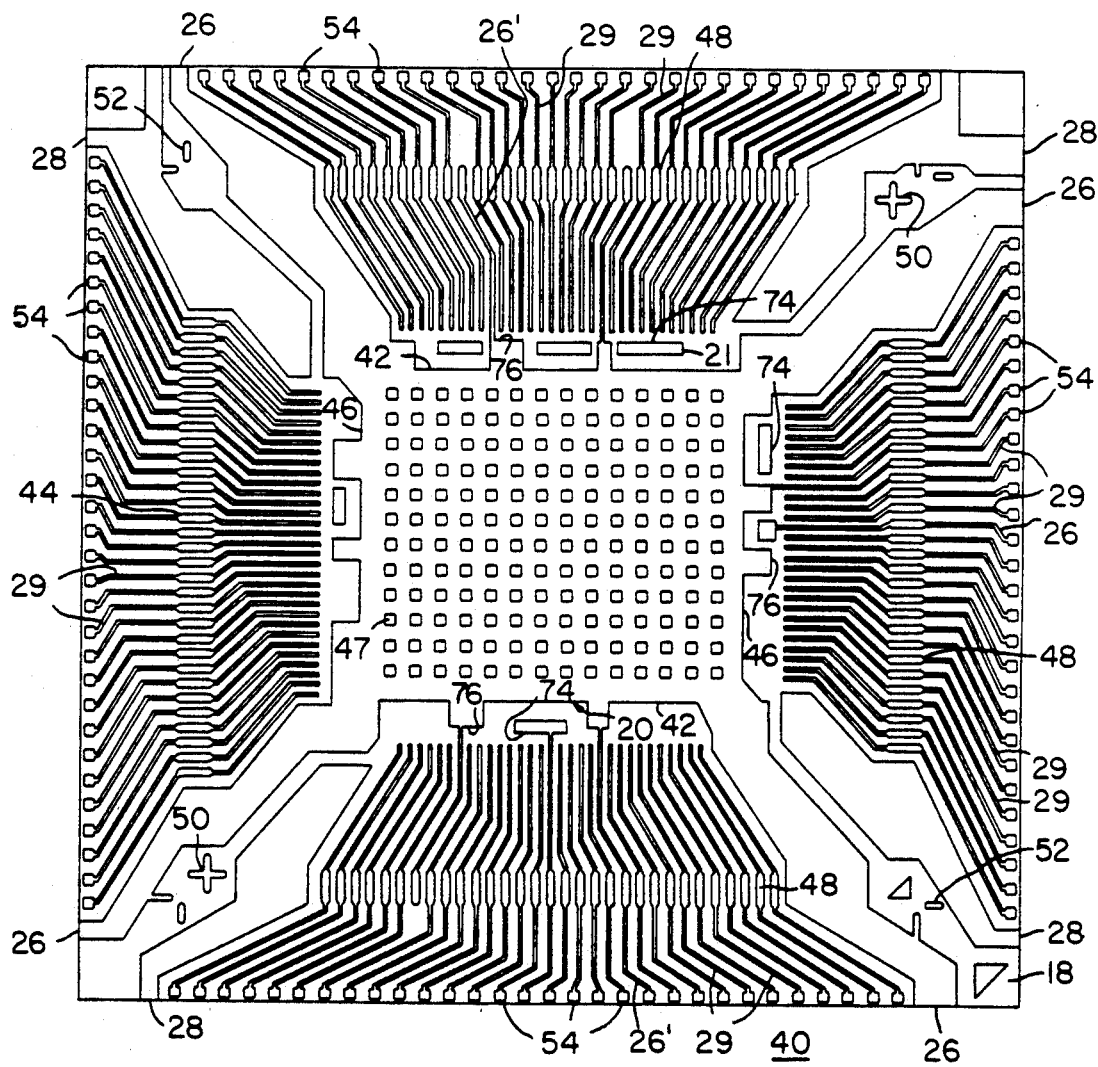
FIG. 2 is a plan view of a substrate illustrating a first metallic layer in accordance with the invention for deposition on the substrate in accordance with the invention.

As further embodied herein and referring to FIG. 2, a first metallic layer generally referred to as 40 is deposited on insulative substrate 18. Metallic layer 40 includes the central area portion 20, which is substantially rectangular in configuration for defining the mounting area for the chip and in the present illustrated embodiment serves as the power plane of the package. The plurality of metallic leads 26 are electrically connected to central area portion 20. The plurality of metallic leads 28 and 29 are spaced apart from central area portion 20 and the first plurality of metallic leads 26. Leads 26, 28 and 29 extend outwardly close to the edge of substrate 18. A portion of the leads 28 are utilized as conductive ground pads for a ground plane hereinafter described. Outwardly extending leads 26 and 28 preferably have a width that is substantially wider than metallic leads 29, wherever possible such as at the four corners, in order that the power and ground connections may have minimal inductance.

Central area portion 20 has a first pair of opposite edges 42 and a second pair of opposite edges 46 normal to edges 42. Metallic leads 26 at an inner end fan diagonally outwardly from each juncture of the first pair of opposite edges 42 and 46. Each lead 28 has an inner end spaced from but adjacent to a lead 26. Each of the leads 29 has inner aligned ends spaced from an opposite edge 42 or 46. Leads 29 are preferably approximately 5 mils wide and are spaced approximately 5 mils from their adjacent leads. Leads 29 are substantially parallel to each other and fan out and terminate at the edge of the substrate.

Intermediate inner and outer ends of each lead 29 is an oblong portion 48 of increased width. Oblong portions 48 are aligned with each other and the outer edges of oblong portions 48 preferably serve as line 12 for scribing and separating package 16 as shown in FIG. 1. Between each of the metallic leads 26 and 28 are registration marks 50 used for subsequent operations of aligning the position of the part for automatic wire bonding. Terminations 54 at the outer edge of layer 40 are spaced to align and connect with pads in a metallic layer that overlays layer 40 for appropriate test socket and burn-in connections as described hereinafter.

Central area portion 20 has a plurality of openings 47 therein so that a dielectric layer can better adhere to substrate 18. As herein embodied, central area portion 20 has a grid of openings 47 for improving adhesion.

According to the present invention a dielectric layer is provided having a first area portion overlaying and at least coextensive with the central area portion of the first layer and having an annular portion surrounding and spaced from the first area portion and overlaying a portion of each of the first and second plurality of metallic leads. As herein embodied, and referring to FIG. 3, dielectric layer 22 includes a rectangular central portion 56 and an annular portion 58 spaced from and surrounding central portion 56. Annular portion 58 of dielectric layer 22 is preferably rectangular in shape and includes a plurality of openings 60 which are aligned with selected ones of the second plurality of metallic leads 28 for permitting electrical connection of a succeeding metallic layer hereinafter described. Central portion 56 covers the power plane or central area portion 20 of first metallic layer 40, and annular portion 58 overlays each of the metallic leads 26, 28 and 29 intermediate their inner ends and the oblong portions 48, as shown in FIGS. 1 and 2. At each corner of the rectangular central portion 56 of layer 22 are irregular projections 67 that are configured to cover the portions of the first plurality of leads 26 that connect to central portion 20 and lie between the inner ends of the second plurality of leads 28 and 29, and the respective opposite edges 42 and 46 of the rectangular first area. Opposite edges 71 of the first area portion are farther apart than corresponding opposite edges of the central area portion 20 of the first metal layer, and therefore overlap edges 42 and 46 of the first metallic layer.

Dielectric layer 22 may also include outer rectangular boundary strips 61 that cover the outer ends of leads 26, 28, and 29 at the edge of substrate 18 spaced from rectangular annulus 58. Each side of the rectangular substrate 18 is covered by one of the rectangular strips 61 with the exception that a substantially square portion 63 at each corner of the substrate may or may not be covered. Adjacent the outer edge of each rectangular strip 61 are aligned openings 65, each of which registers with one of the terminations 54 of leads 29 of the first layer (FIG. 2).

Figure 4:
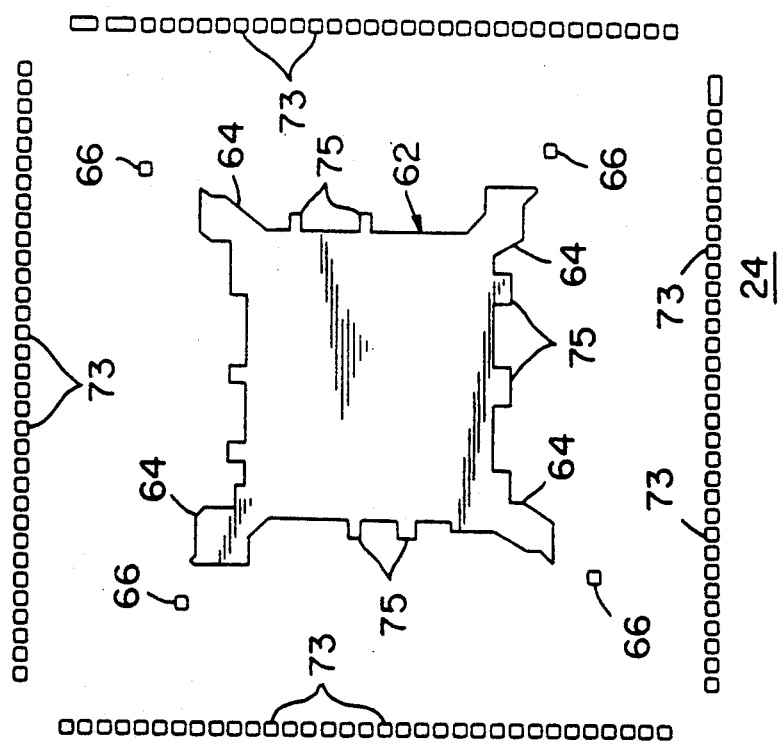
FIG. 4 illustrates a second metallic layer in accordance with the present invention for deposition on the dielectric layer of FIG. 3.

The present invention includes, a second metallic layer having a central area portion serving as the other of the power and ground planes of the package overlaying at least a portion of the first area portion of the dielectric layer and predetermined ones of the second plurality of metallic leads of the first layer without being in electrical contact with the first plurality of metallic leads. Referring to FIG. 4, and as embodied herein, metallic layer 24 has a generally rectangular central area portion 62 that overlays the first area portion 56 of dielectric layer 22. Rectangular portion 62 has adjacent each corner thereof irregular projections 64, which essentially overlap projections 67 of the dielectric layer 22 so that metallic layer 62 does not come into electrical contact with any of the first plurality of outwardly extending metallic leads 26 (FIG. 2). Projections 64 extend beyond projections 67 and engage and electrically connect with each outwardly extending lead 28. Additionally, second metallic layer 24 includes four, spaced, substantially rectangular areas 66 which are aligned with openings 60 of the dielectric layer for providing metal contact with conductive leads 28 through openings 60 of annular portion 58 of dielectric layer 22. Second metallic layer 24 preferably serves as the ground plane of the package of the present invention.

The second metallic layer may include spaced, aligned, metal pads 73 that are disposed to align with openings 65 of rectangular strips 61 of dielectric layer 22 for filling the openings and providing metal contact to the terminations 54 of layer 40 (FIG. 2).

In accordance with the present invention, the first metallic layer may comprise a plurality of metallic islands adjacent to but spaced from the rectangular central area portion and the first and second plurality of outwardly extending leads, and the central area of the second metallic layer may include at least one projecting portion overlaying and in electrical contact with each of the metallic islands to serve as bonding pads for the corresponding power or ground plane. As embodied herein and referring to FIG. 2, each of the metallic islands 74 are substantially rectangular in configuration and are spaced between the inner ends of outwardly extending leads 29 and opposing edges 42, 46 of central area portion 20 of the first metallic layer 20. With reference to FIG. 4, central portion 62 of metallic layer 24 has projections 75 intermediate corner projections 64 for electrically contacting an aligned corresponding one of the islands 74 for providing ground pads additional to those referred to at 28.

As further embodied herein, central area portion 20 of the first metallic layer may have projections 76 for connecting the power or ground plane as the case may be to predetermined ones of outwardly extending leads 29. Islands 74 and projections 76 have greater width than outwardly extending leads 29 for providing decreased inductance to the power and ground planes of the package.

Figure 3:
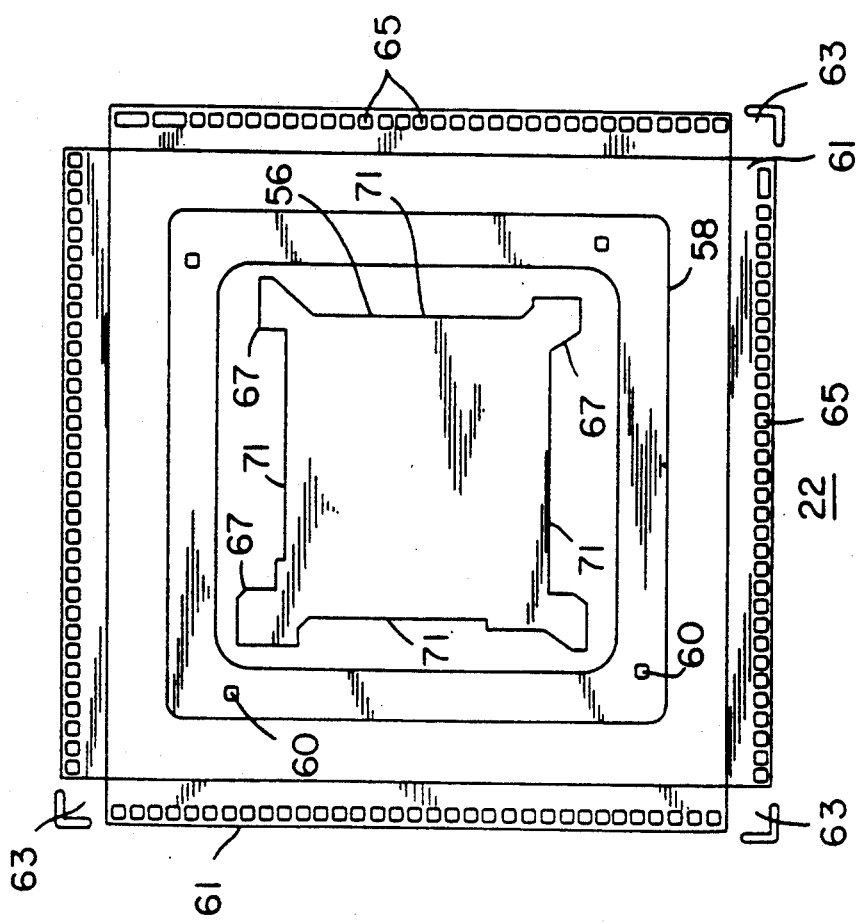
FIG. 3 is a plan view of a dielectric layer in accordance with the present invention for deposition on the first metallic layer of FIG. 2.
Figure 5:
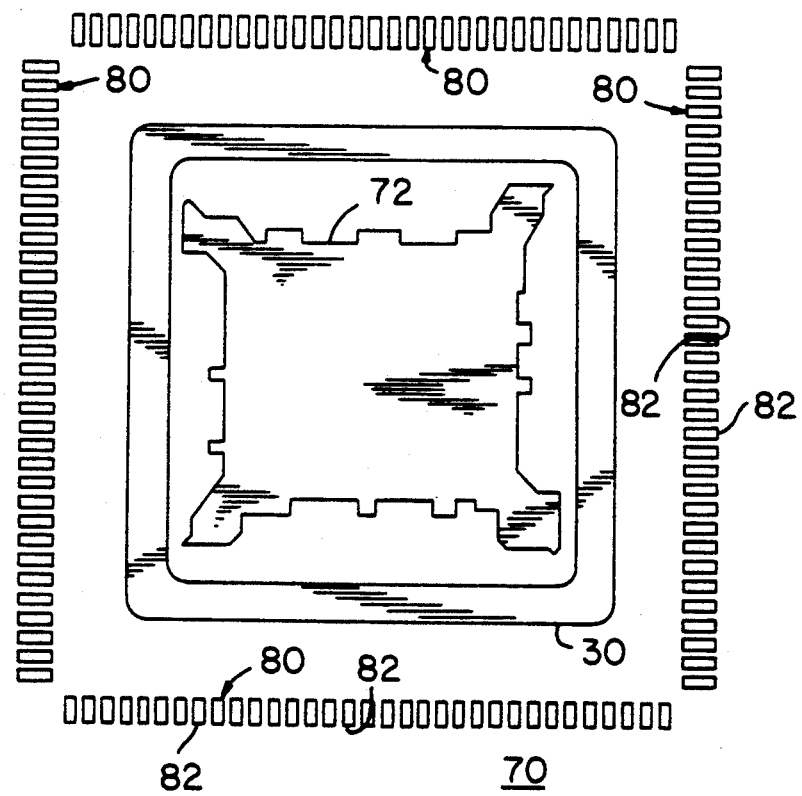
FIG. 5 is a plan view of a third metallic layer in accordance with the present invention for deposition on the second metallic layer of FIG. 4.

In accordance with the present invention, a third metallic layer overlaying the annular portion of the dielectric layer may be provided. As herein embodied, and referring to FIG. 5, layer 70 includes an annular portion 30 surrounding a central rectangular portion 72. The annular portion 30 serves as a sealing ring, the metallic surface of which overlays dielectric portion 58 of layer 22 (FIG. 3). Ring 30 is connected to the ground plane of the package. In the illustrated embodiment, ring 30 is in contact with outwardly extending conductive leads 28 through connection with metallic areas 66 that fills hole 60 of dielectric layer 22. Central portion 72 of the third metallic layer preferably overlays the central area 62 of the second metallic layer 24 and serves to make the overall central area thicker than would ordinarily be the case with a single second layer. In the event that second metallic layer 24 has sufficient thickness to eutectically mount a chip at the central area portion, the central portion 72 of the third metallic layer 70 may be omitted.

Third metallic layer 70 includes spaced oblong border pads 80, each of which is aligned at its outer end portion 82 with a corresponding metal pad 73 of second metallic layer 24. Pads 80 are positioned to coincide with standard test pads (not shown) of well known testing apparatus for testing integrated circuit chip packages. Outer ends 82 of pads 80 and termination points 54 coincide, thus permitting oblong pads 82 to be properly spaced irrespective of the angle of outwardly extending leads 29; or by having pads 80 deposited on dielectric layer 22, the number of leads 29 can be more closely spaced without creating a short between adjacent pads.

The present invention utilizing a first metallic layer as shown in FIG. 2 and a second metallic layer as shown in FIG. 4 enables close spacing of power and ground wires on the perimeter of the defined chip mounting area. Also, a chip may have many power and ground pads for lowering the overall inductance of the power and ground connections from the chip to the package. For example, a package utilizing the first metallic layer of FIG. 2 has a total of 74 power and ground connections which as previously described, are distributed around the perimeter of the chip and sometimes in close proximity to each other and to other signal bonding pads. With the present invention, the power and ground bonding pads on the substrate may be close enough to accommodate the close spacing on the chip without running the risk of the power and ground planes actually touching one another and shorting as might occur with slight misregistration of the power and ground layers. Also, by positioning outermost test pads on a dielectric layer that is not limited by the fanning angle of the leads, permits more space between leads for a given number of leads.

After an integrated circuit chip is mounted and wire bonded to the package, a cover made of gold plated Kovar, for example, may be soldered to metallic ring 30 to form a hermetic enclosure; or a Kovar cover can be sealed directly to the dielectric annular ring with glass if the metal seal ring on the dielectric is omitted.

Figure 6:
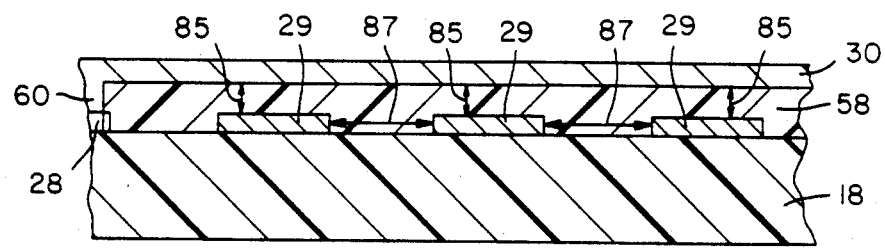
FIG. 6 is a fragmentary sectional view in elevation showing the location of the signal leads of the first metallic layer relative the annular portion of the third metallic layer.

The package for mounting an integrated circuit includes means for reducing capacitive coupling between the multiple, closely-spaced, outwardly-extending leads. As herein embodied, and referring to FIG. 6, leads 29 are approximately one-half mil thick, approximately five mils wide and spaced apart approximately five mils. Dielectric layer 58 is approximately one mil thick directly above leads 29. Metallic ring 30 is approximately one-half mil thick and, as previously mentioned, is connected to ground, such as through opening 60 to lead 28, for example. With rectangular ring 30 crossing all of the leads, capacitance will exist between ring 30 and leads 29 across the one-mil dielectric bridge to lead 29 in a direction indicated by arrow 85. This will be greater than the capacitance between the five-mil gap represented by arrow 87. Therefore, most of the capacitive coupled current will be shunted to ground rather than coupling to an adjacent lead.

Figure 7:
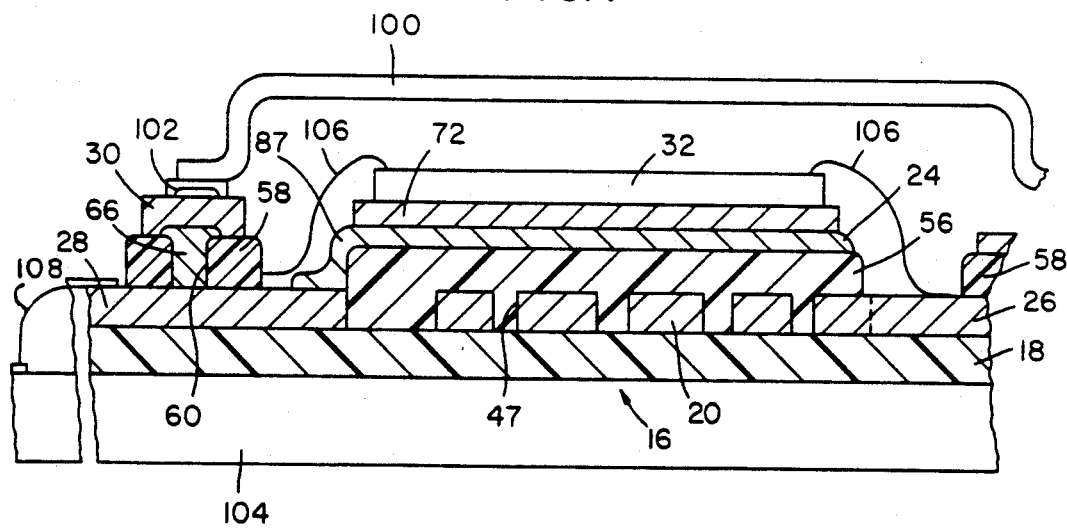
FIG. 7 is a fragmentary highly magnified sectional view in elevation of the dielectric and metallic layers and illustrating the manner in which an integrated circuit chip package and mounted chip is assembled to a printed circuit board with a cover hermetically sealing the mounted chip.

The method of making a package for an integrated circuit chip in accordance with the present invention, is through thick film techniques; which includes depositing on the substrate a first metallic layer having a central area portion defining a mounting area for the chip and serving as either a power or ground plane, and has a first plurality of metallic leads connected to and extending outwardly from the central area portion and a second plurality of leads including outwardly extending leads having an inner end adjacent to and spaced from the central portion for selective connection to the other of a power or ground plane. Referring to FIG. 7, substrate 18 is preferably a ceramic such as aluminum oxide, aluminum nitride, or garnet, for example. However, it may be any material on which a thick film can be printed. Such a material should be able to assume full density at approximately 1,600° C. The metallic layer 40 is a thick film, which may be a mixture of metal powder, glass, and copper oxide in a proportion to bind to the surface of the substrate. The first layer should be a mixture that will also permit good wirebond reliability with both aluminum and gold wire. The metallic mixture, which is preferably gold is first printed on the ceramic substrate with a squeegee through a screen in a well known manner, and then fired at approximately 850° to 925° for an approximate 1 hour cycle in air. The completed layer 40 is approximately one-half mil thick. In practice, layer 40 may be dried at about 150° C. before firing.

The invention further includes screening a dielectric layer including a first area portion on the central area portion of the first layer at least coextensive with the central area portion and including an annular substantially rectangular portion surrounding and spaced from the first area portion overlaying a portion of each of the first and second plurality of conductive paths. With reference to FIG. 7, the dielectric layer includes central portion 56 and annular portion 58, and is preferably a thick film glassy dielectric which is fired at temperatures of approximately 850° C., for example. Package 16 includes substrate 18, on which is screened the first metallic layer which includes central area portion 20 having openings 47 therein for permitting the dielectric layer to more securely bond to the ceramic substrate. The dielectric layer may be dried at approximately 150° C., and then fired at the aforementioned temperature prior to the screening of the next layer.

The method of the invention next includes screening a second metallic layer on and overlapping the central portion of the dielectric layer in electrical contact with the leads not connected to the central area portion of the first layer. As embodied herein and referring to FIG. 7, the second metallic layer includes central portion 24 which overlays the first area portion 56 of the dielectric layer and overlaps portion 56 at reference 87 of FIG. 7. The screen for the layer is aligned with appropriate registration marks well known in the art. The second metallic layer also includes a portion 66 which is aligned with and fills hole or via 60 of annular portion 58 of the dielectric layer to electrically engage ground lead 28. Second metallic layer 22 is a thick film which may be similar in thickness and content to first metallic layer 40 and is fired on the dielectric layer and a portion of the first layer at a temperature of approximately 850° to 925°. Each one of the layers 40, 22, and 24 may be individually fired in succession, or each layer may be printed and dried at a temperature of approximately 150° C. prior to applying a succeeding layer. These multiple layers can then be fired simultaneously. Thus, the package now includes a power plane corresponding to central region 20 of the first layer and a ground plane corresponding to metallic layer 24.

A third metallic layer having central portion 72 and an annular portion 30 is screened on the central portion of the second metallic layer. The annular portion 30 of the third metallic layer electrically contacts metallic portion 66 in hole 60 for grounding the sealing ring for the cover but is electrically insulated from leads 20. Central portion 72 of the third metallic layer is optional and serves to thicken the top layer of the package for permitting eutectic bonding and connecting of a chip 32 thereto.

The third metallic layer may also include pads 80 fired to dielectric portion 61 as previously described. This layer may be fired to the previously screened layers which may be either dried or fired prior to the application of the third metallic layers.

After the chip has been hermetically sealed, tested, and burned-in as previously described, it is attached to suitable connections on a printed circuit board such as 104 with wires 108 connecting the substrate metalization pads 48 to suitable bonding pads, such as 12 adjacent the perimeter of the mounting area of the substrate. The application of any of the metallic layers or the dielectric layer may be repeated in the event that it is desired to have layers of increased thickness for certain applications. After the individual ceramic packages have been laser scribed and snapped apart, they may be mounted to printed circuit boards and assembled as described in detail in my U.S. Pat. No. 4,730,232 to which reference is made for a more detailed description thereof.

It will be apparent to those skilled in the art that various modifications and variations can be made in the integrated circuit chip package and method of making the same of the present invention without departing from the scope and spirit of the invention. For example, the first metallic layer may or may not constitute a ground plane and the second metallic layer, may or may not constitute a power plane. The defined chip mounting area can be made to accommodate more than one integrated circuit chip. Thus, it is intended that the present invention cover the modifications and variations of this invention provided they come within the scope of the appended claims and their equivalents.

I claim:

1. An integrated circuit chip package, comprising:
a ceramic substrate;
a first metallic layer overlaying the substrate, the first metallic layer having a central area portion defining a mounting area for the chip,
the first metallic layer including a first plurality of leads connected to and extending outwardly from the central area portion and a second plurality of outwardly extending leads spaced from the central area portion;
a dielectric layer having a first area portion overlaying and at least coextensive with the central area portion of the first layer and having an annular portion surrounding and spaced from the first area portion overlaying a portion of each of the first and second plurality of conductive leads; and
a second metallic layer having a central area portion overlaying the first area portion of the dielectric layer and predetermined areas of the second plurality of leads of the first layer without being in electrical contact with the first plurality of leads.

2. The package of claim 1 further comprising a third metallic layer overlaying the annular portion of the dielectric layer.

3. The packaging of claim 1 wherein the first metallic layer serves as one of a power and ground plane of the package and the second metallic layer serves as the other of the power and ground plane of the package.

4. The package of claim 1 wherein the central area portion is substantially rectangular in configuration and the first plurality of leads extend from each corner of the central area portion.

5. The package of claim 1 wherein the central area portion has at least one aperture therein for exposing a portion of the ceramic substrate to the overlaying first area portion of the dielectric layer.

6. The package of claim 1 wherein the first plurality of leads and predetermined ones of the second plurality of leads each have a minimum width dimension greater than a maximum width dimension of the second plurality of leads other than the predetermined ones of the second plurality, said other leads being spaced signal leads having an inner end spaced from the defined mounting area and an outer end outwardly of the defined mounting area, the first plurality and the predetermined ones of the second plurality having inductances less than the signal leads.

7. The package of claim 1 wherein the first layer further comprises a plurality of metallic islands adjacent to but spaced from the central area portion and the first and second plurality of outwardly extending leads, and the central area portion of the second layer includes a projecting portion overlaying in electrical contact with each of the metallic islands to serve as bonding pads for the respective power or ground plane.

8. The package of claim 1, further comprising an annular cover hermetically sealing the chip mounting area.

9. The package of claim 2 wherein the central area portion of the first layer serves as a ground plane and the annular portion of the dielectric layer has at least one opening exposing a portion of at least one of the first plurality of leads, said third layer including an annular portion electrically contacting said at least one of the first plurality of leads.

10. The package of claim 2 wherein the central area portion of the first layer serves as a power plane and the second metallic layer serves as a ground plane, said second metallic layer being in contact with at least one of the second plurality of metallic leads.

11. The package of claim 1 wherein the first metallic layer further includes at least one metallic portion spaced from the central area portion and the first plurality of leads, and wherein the central area portion of the second metallic layer engages at least one spaced metallic portion of the first layer.

12. The package of claim 2 wherein the annular portion of the third metallic layer is closer to each of the second plurality of leads than each of the adjacent second plurality of leads are to each other minimizing capacitive coupling between leads.

13. The package of claim 12 wherein the central area portion of the second metallic layer include projections engaging predetermined ones of the second plurality of leads.

14. The package of claim 6 wherein the signal leads each have a portion of increased width over a predetermined length intermediate the inner and outer end of the corresponding signal lead, each of the increased width portions terminating adjacent the outer end in alignment at substantially the same distance from an opposing edge of the defined mounting area;

15. The package of claim 11 wherein the outer ends of each of the leads has a portion of increased width overlaying the dielectric layer serving as probe pads for a test socket.

16. The package of claim 1 wherein the dielectric layer further includes a boundary strip overlaying the first metallic layer at outer extreme ends of at least the signal leads, said boundary strip having a plurality of spaced openings in registry with the signal leads; and a metallic layer subsequent to the first metallic layer including a plurality of test probe pads overlaying the dielectric strip in registry with an opening of the dielectric layer.

17. The package of claim 16 wherein the second metallic layer includes a plurality of spaced metallic portions in registry with an opening in the dielectric strip and the third metallic layer includes the spaced test probe pads.

18. The package of claim 1 having means including the third metallic layer for reducing capacitive coupling between the outwardly extending leads.

* * * * *

UNITED STATES PATENT AND TRADEMARK OFFICE
CERTIFICATE OF CORRECTION

PATENT NO. : 5,175,397
DATED : December 29, 1992
INVENTOR(S) : Frank A. Lindberg It is certified that error appears in the above-identified patent and that said Letters Patent is hereby corrected as shown below:

Column 1, line 3, after the title insert -- This invention was made with Government support under n00019-88-C-0151 awarded by the Department of the Navy. The Government has certain rights in this invention. --.

Signed and Sealed this

Third Day of March, 1998

*Attest:*

BRUCE LEHMAN

*Attesting Officer*  Commissioner of Patents and Trademarks